US012584961B2

(12) United States Patent
Singh et al.

(10) Patent No.: US 12,584,961 B2
(45) Date of Patent: Mar. 24, 2026

(54) BUILT-IN SELF TEST CIRCUIT FOR SEGMENTED STATIC RANDOM ACCESS MEMORY (SRAM) ARRAY INPUT/OUTPUT

(71) Applicant: STMicroelectronics International N.V., Geneva (CH)

(72) Inventors: Bhupender Singh, New Delhi (IN); Hitesh Chawla, Noida (IN); Tanuj Kumar, Noida (IN); Harsh Rawat, Faridabad (IN); Kedar Janardan Dhori, Ghaziabad (IN); Manuj Ayodhyawasi, Noida (IN); Nitin Chawla, Noida (IN); Promod Kumar, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 303 days.

(21) Appl. No.: 18/228,048

(22) Filed: Jul. 31, 2023

(65) Prior Publication Data

US 2024/0069096 A1 Feb. 29, 2024

Related U.S. Application Data

(60) Provisional application No. 63/402,189, filed on Aug. 30, 2022.

(51) Int. Cl.
*G11C 11/419* (2006.01)
*G01R 31/317* (2006.01)
*G11C 11/418* (2006.01)

(52) U.S. Cl.
CPC ...... *G01R 31/31724* (2013.01); *G11C 11/418* (2013.01); *G11C 11/419* (2013.01)

(58) Field of Classification Search
CPC ................................ G11C 11/418; G11C 7/00
See application file for complete search history.

(56) References Cited

U.S. PATENT DOCUMENTS 5,568,437 A 10/1996 Jamal
6,343,366 B1 * 1/2002 Okitaka ................. G11C 29/44
714/719

(Continued)

FOREIGN PATENT DOCUMENTS

CN 103065687 A 4/2013

OTHER PUBLICATIONS

Cai, Zhikuang, et al: "A Novel BIST Algorithm for Low-voltage SRAM," 2019 IEEE International Test Conference in Asia (ITC-Asia), 2019, 6 pgs.

*Primary Examiner* — Hoai V Ho
*Assistant Examiner* — Anthony Thinh Tang
(74) *Attorney, Agent, or Firm* — Crowe & Dunlevy LLC

(57) ABSTRACT

An array of a memory includes sub-arrays with memory cells arranged in a row-column matrix where each row includes a word line and each sub-array column includes a local bit line. A row decoder supports two modes of memory operation: a first mode where only one word line in the memory array is actuated during a read and a second mode where one word line per sub-array are simultaneously actuated during the read. An input/output circuit for each column includes inputs to the local bit lines of the sub-arrays, a column data output coupled to the bit line inputs, and a sub-array data output coupled to each bit line input. BIST testing of the input/output circuit is supported through data at both the column data output and the sub-array data outputs in order to confirm proper memory operation in support of both the first and second modes of operation.

19 Claims, 8 Drawing Sheets

(56)        References Cited

U.S. PATENT DOCUMENTS

| | | | | |
|---|---|---|---|---|
| 6,768,685 | B1 * | 7/2004 | Scheuerlein | G11C 29/34 |
| | | | | 365/201 |
| 6,895,537 | B2 * | 5/2005 | Kawagoe | G11C 29/44 |
| | | | | 365/201 |
| 8,924,805 | B2 | 12/2014 | Sul et al. | |
| 8,966,329 | B2 | 2/2015 | Clark et al. | |
| 9,412,437 | B2 | 8/2016 | Deng et al. | |
| 10,720,205 | B2 | 7/2020 | Huang et al. | |
| 10,867,681 | B2 * | 12/2020 | Clinton | G11C 16/08 |
| 11,080,226 | B2 | 8/2021 | Tomishima et al. | |
| 2020/0005128 | A1 | 1/2020 | Temam et al. | |

* cited by examiner

BUILT-IN SELF TEST CIRCUIT FOR SEGMENTED STATIC RANDOM ACCESS MEMORY (SRAM) ARRAY INPUT/OUTPUT

CROSS REFERENCE TO RELATED APPLICATIONS

This application claims priority from U.S. Provisional Application for Patent No. 63/402,189, filed Aug. 30, 2022, the disclosure of which is incorporated herein by reference.

TECHNICAL FIELD

Embodiments herein relate to built-in self test (BIST) circuitry and, in particular, to BIST circuitry used for testing an input/output (I/O) circuit of a segmented static random access memory (SRAM) array.

BACKGROUND

A conventional memory circuit 10 as shown in FIG. 1 may include a static random access memory (SRAM) array 12 formed by a plurality of SRAM memory cells 14 arranged in a matrix format having N rows and M columns. Each SRAM memory cell is of a well-known 8T-type (see, FIG. 2) and includes a word line WL, a pair of complementary (write) bit lines BLT and BLC, a read word line RWL and a read bit line RBL. The SRAM memory cells in a common row of the matrix are connected to each other through a common word line WL and through a common read word line RWL. Each of the word lines (WL and/or RWL) is driven by a word line driver circuit 16 with a word line signal generated by a row decoder circuit 18 during read and write operations. The SRAM memory cells in a common column of the matrix across the whole array 12 are connected to each other through a common pair of complementary bit lines BLT and BLC and through a common read bit line RBL. Each of the bit lines (BLT, BLC and RBL) is coupled to a column input/output (I/O) circuit 20. A data input port (D) of the column I/O circuit 20 receives input data to be written to an SRAM memory cell 14 in the column through the bit lines BLT, BLC in response to assertion of a word line signal. A data output port (Q) of the column I/O circuit 20 generates output data read from an SRAM memory cell 14 in the column through the read bit line RBL in response to assertion of a read word line signal. A control circuit controls operations of the circuitry within the memory.

With reference now to FIG. 2, each memory cell 14 includes two cross-coupled CMOS inverters 22 and 24, each inverter including a series connected p-channel and n-channel MOSFET transistor pair. The inputs and outputs of the inverters 22 and 24 are coupled to form a latch circuit having a true data storage node QT and a complement data storage node QC which store complementary logic states of the stored data bit. The cell 14 further includes two transfer (passgate) transistors 26 and 28 whose gate terminals are driven by a word line WL. The source-drain path of transistor 26 is connected between the true data storage node QT and a node associated with a true bit line BLT. The source-drain path of transistor 28 is connected between the complement data storage node QC and a node associated with a complement bit line BLC. The source terminals of the p-channel transistors 30 and 32 in each inverter 22 and 24 are coupled to receive a high supply voltage (for example, Vdd) at a high supply node, while the source terminals of the n-channel transistors 34 and 36 in each inverter 22 and 24 are coupled to receive a low supply voltage (for example, ground (Gnd) reference) at a low supply node. A signal path between the read bit line RBL and the low supply voltage reference is formed by series coupled transistors 38 and 40. The gate terminal of the (read) transistor 38 is coupled to the complement storage node QC and the gate terminal of the (transfer) transistor is coupled to receive the signal on the read word line RWL. The word line driver circuits 16 are also typically coupled to receive the high supply voltage (Vdd) at the high supply node and is referenced to the low supply voltage (Gnd) at the low supply node.

SUMMARY

In an embodiment, a memory circuit comprises: a memory array including a plurality of sub-arrays, wherein each sub-array includes memory cells arranged in a matrix with plural rows and plural columns, each row including a word line connected to the memory cells of the row, and each column including a local bit line connected to the memory cells of the column; a word line drive circuit for each row having an output connected to drive the word line of the row; a row decoder circuit configured to support two modes of memory circuit operation including: a first mode where the row decoder circuit actuates only one word line in the memory array during a memory read and a second mode where the row decoder circuit simultaneously actuates one word line per sub-array during the memory read; and an input/output circuit for each column.

Each input/output circuit comprises: a plurality of bit line inputs coupled to the local bit lines of the sub-arrays; a column data output coupled to the plurality of bit line inputs; and a plurality of sub-array data outputs, where each sub-array data output is coupled to a corresponding bit line input.

In an embodiment, built-in self test (BIST) operations are supported for the read circuitry of each input/output circuit.

In an embodiment, a BIST circuit is configured to perform BIST testing of the memory circuit dependent on data generated at the column data output and perform BIST testing of the memory circuit dependent on data generated at the plurality of sub-array data outputs.

In an embodiment, a BIST circuit is configured to: apply BIST test data to the memory cells of the memory array; process data generated at the column data output in response to the applied test data to test the memory circuit for proper operation in support of the first mode of operation; compare said data generated at the column data output to data generated at a selected one of the plurality of sub-array data outputs in response to the applied test data; and process a result of the comparison to test the memory circuit for proper operation in support of second mode of operation.

In an embodiment, the BIST circuit is configured to: apply BIST test data to the memory cells of the memory array, said test data corresponding to write data; process data generated at the column data output in response to the applied test data to test the memory circuit for proper operation in support of the first mode of operation; compare said write data to read data generated at a selected one of the plurality of sub-array data outputs in response to the applied test data; and process a result of the comparison to test the memory circuit for proper operation in support of the second mode of operation.

In an embodiment, the BIST circuit is configured to: apply BIST test data to the memory cells of the memory array; process data generated at the column data output in response to the applied test data to test the memory circuit for proper operation in support of the first mode of operation; compare said data generated at the column data output to data generated at a selected one of the plurality of sub-array data outputs in response to the applied test data to generate a flag signal; and process the flag signal to test the memory circuit for proper operation in support of the second mode of operation.

In an embodiment, the BIST circuit is configured to: apply BIST test data to the memory cells of the memory array; select data generated at the plurality of bit line inputs in response to the applied test data for output at the column data output during memory circuit operation in the first mode of operation; process said data generated at the column data output to test the memory circuit for proper operation in support of the first mode of operation; select data generated at the plurality of sub-array data outputs in response to the applied test data for output at the column data output during memory circuit operation in the second mode of operation; and process said data generated at the column data output to test the memory circuit for proper operation in support of the second mode of operation.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 1:
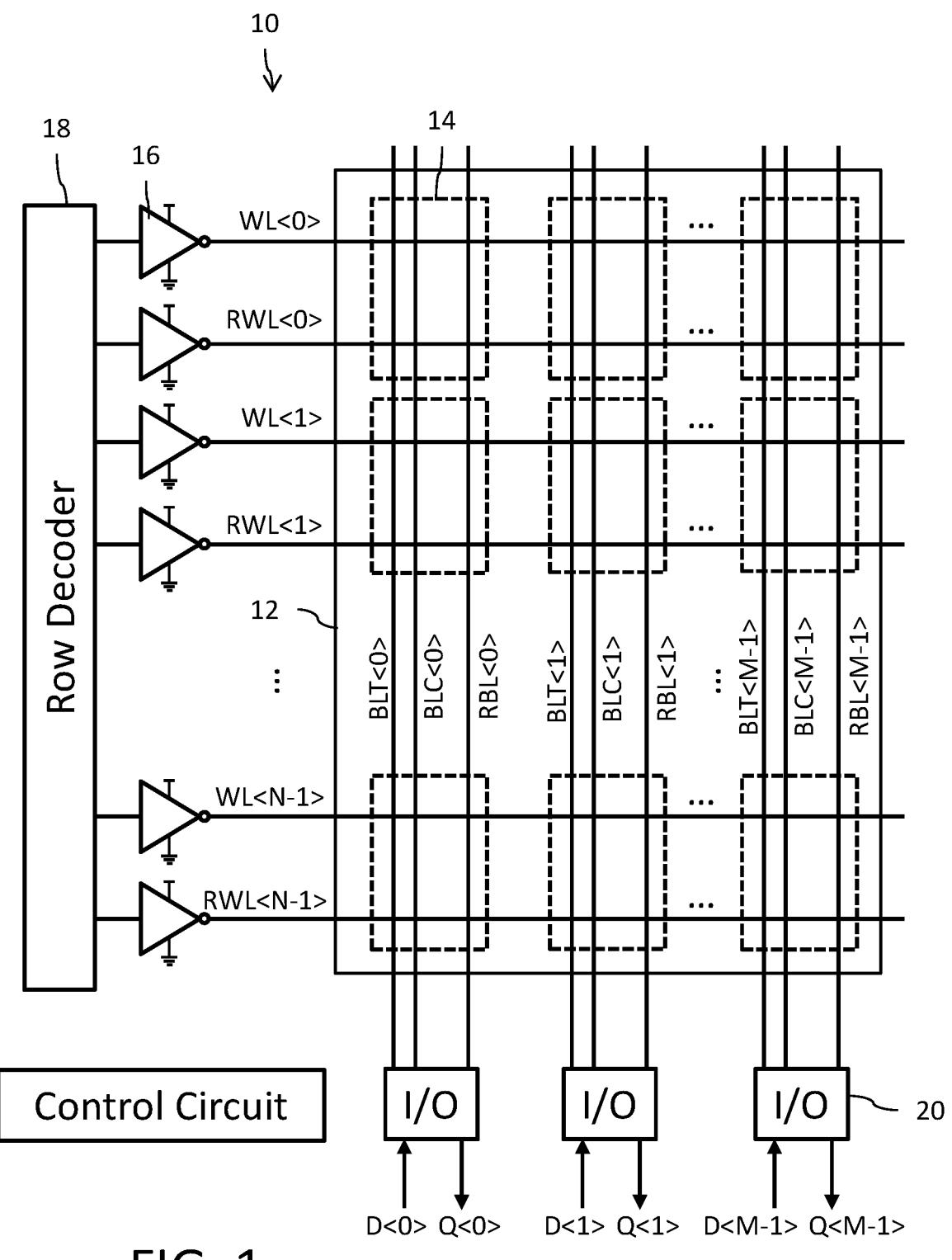
FIG. 1 is a schematic diagram of a conventional memory circuit.
Figure 2:
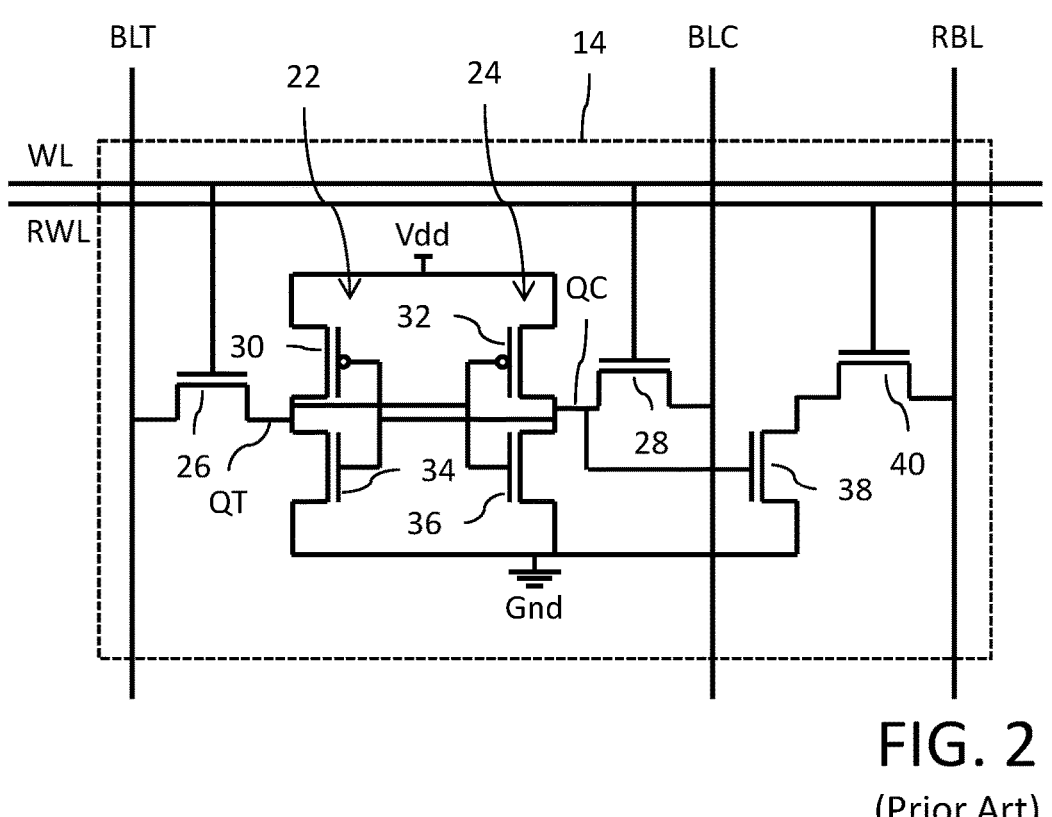
FIG. 2 is a circuit diagram of a standard 8T static random access memory (SRAM) cell as used the memory array shown in FIG. 1.
Figure 3:
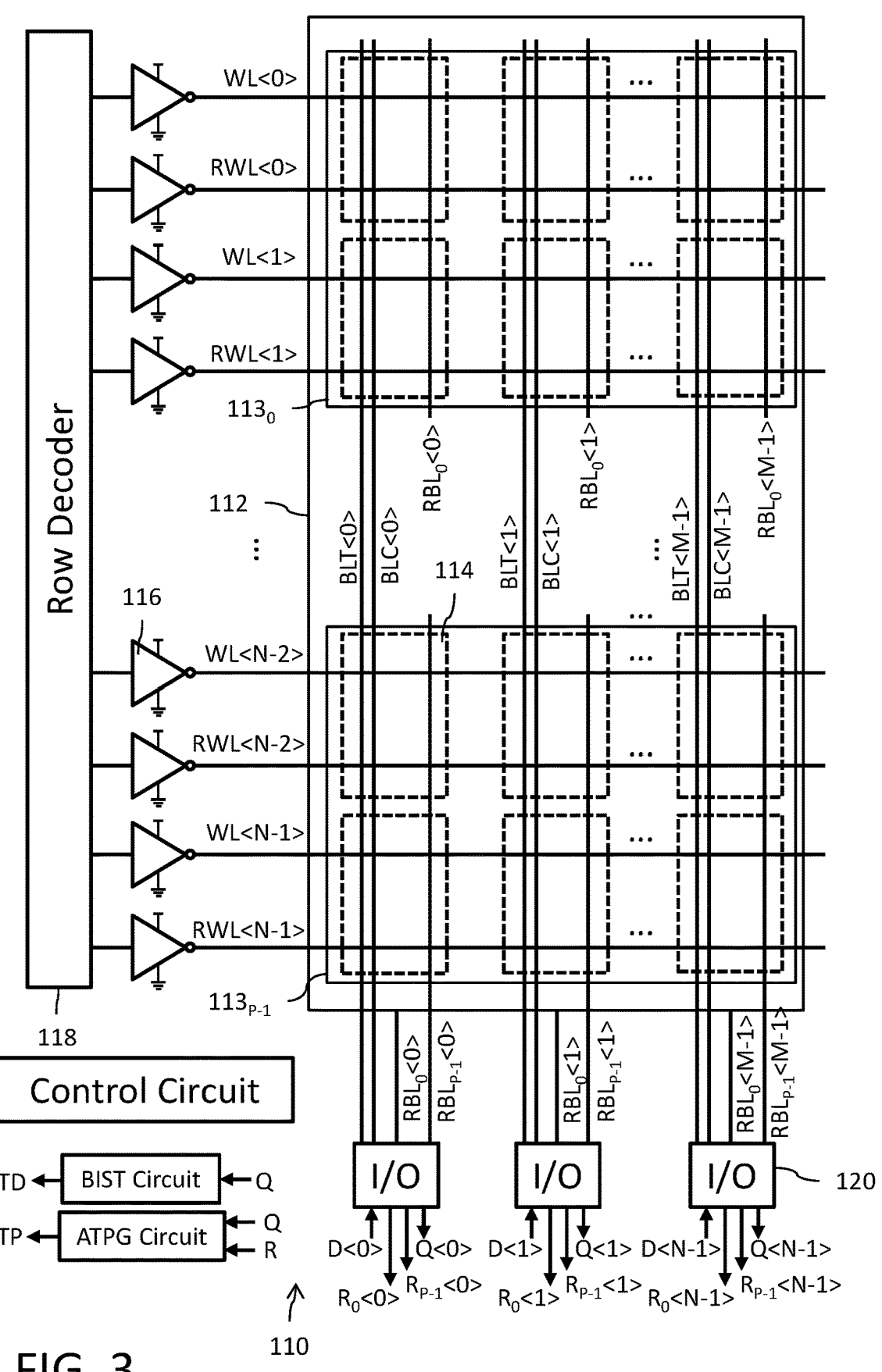
FIG. 3 is a schematic diagram of a memory circuit.

Reference is now made to FIG. 3 which shows a block diagram of a memory circuit 110. The circuit 110 includes a static random access memory (SRAM) array 112 formed by a plurality of SRAM memory cells 114 arranged in a matrix format having N rows and M columns. Each SRAM memory cell is of a well-known 8T-type (see, FIG. 2) and includes a word line WL, a pair of complementary bit lines BLT and BLC, a read word line RWL and a read bit line RBL. The SRAM memory cells in a common row of the matrix are connected to each other through a common word line WL and through a common read word line RWL. Each of the word lines (WL and/or RWL) is driven by a word line driver circuit 116 with a word line signal generated by a row decoder circuit 118 during read and write operations. The SRAM memory cells in a common column of the matrix across the whole array 112 are connected to each other through a common pair of complementary (write) bit lines BLT and BLC. The array 112 is segmented into P sub-arrays $113_0$ to $113_{P-1}$. Each sub-array 113 includes M columns and N/P rows of memory cells 114. The SRAM memory cells in a common column of each sub-array 113 are connected to each other through a local read bit line RBL. The P local read bit lines $RBL_0<x>$ to $RBL_{P-1}<x>$ from the sub-arrays 113 for the column x in the array 112 are coupled, along with the common pair of complementary bit lines BLT<x> and BLC<x> for the column x in the array 112, to a column input/output (I/O) circuit 120. A data input port (D) of the column I/O circuit 120 receives input data to be written to an SRAM memory cell 114 in the column through the bit lines BLT, BLC in response to assertion of a word line signal. A data output port (Q) of the column I/O circuit 120 generates output data read from an SRAM memory cell 14 in the column through the read bit lines RBL in response to assertion of a read word line signal in a first read mode of operation. Additionally, the column I/O circuit 120 further includes P sub-array data output ports $R_0$ to $R_{P-1}$ to generate output data read from the memory cells 114 on the local read bit line RBL of the corresponding sub-array $113_0$ to $113_{P-1}$, respectively, in response to the simultaneous assertion of a plurality of read word line signals (one per sub-array 113) in a second read mode of operation. A control circuit controls operations of the circuitry within the memory.

It will be understood that the circuit 110 may instead use a different type of memory cell, for example, any form of a bit cell, storage element or synaptic element. As a non-limiting example, consideration is made for the use of a non-volatile memory (NVM) cell such as, for example, magnetoresistive RAM (MRAM) cell, Flash memory cell, phase change memory (PCM) cell or resistive RAM (RRAM) cell). In the following discussion, focus is made on the implementation using an 8T-type SRAM cell 114, but this is done by way of a non-limiting example, understanding that any suitable memory element could be used (e.g., a binary (two level) storage element or an m-ary (multi-level) storage element).

When the memory circuit 110 is operating in the first read mode of operation, the row decoder circuit 118 selectively actuates only one read word line RWL for the whole array 112 with a word line signal pulse to access a corresponding single one of the rows of memory cells 114. The logic state stored in the single accessed memory cell of a column is output to the read bit line RBL and input to the column I/O circuit 120 for output at the data output port Q.

When the memory circuit 110 is operating in the second read mode of operation, the row decoder circuit 118 selectively (and simultaneously) actuates one read word line RWL in each sub-array 113 in the memory array 112 with a word line signal pulse to access a corresponding single one of the rows of memory cells 114 in each sub-array 113. The logic states stored in the single accessed memory cells for the sub-arrays 113 of each column are output to the read bit lines $RBL_0<x>$ to $RBL_{P-1}<x>$ and input to the column I/O circuit $120(x)$ for output at the corresponding sub-array data output ports $R_0$ to $R_{P-1}$. This second read mode of operation, for example, may be implemented in connection with operation of the memory in support of the performance of an in-memory compute operation (where, for example, the memory cells 114 store bits of weight data and feature data is supplied via the word line signal pulses on the read word lines, to a computational circuit in the I/O circuit $120(x)$, or to a digital signal processing circuit coupled to receive data from sub-array data output ports $R_0$ to $R_{P-1}$).

Figure 4:
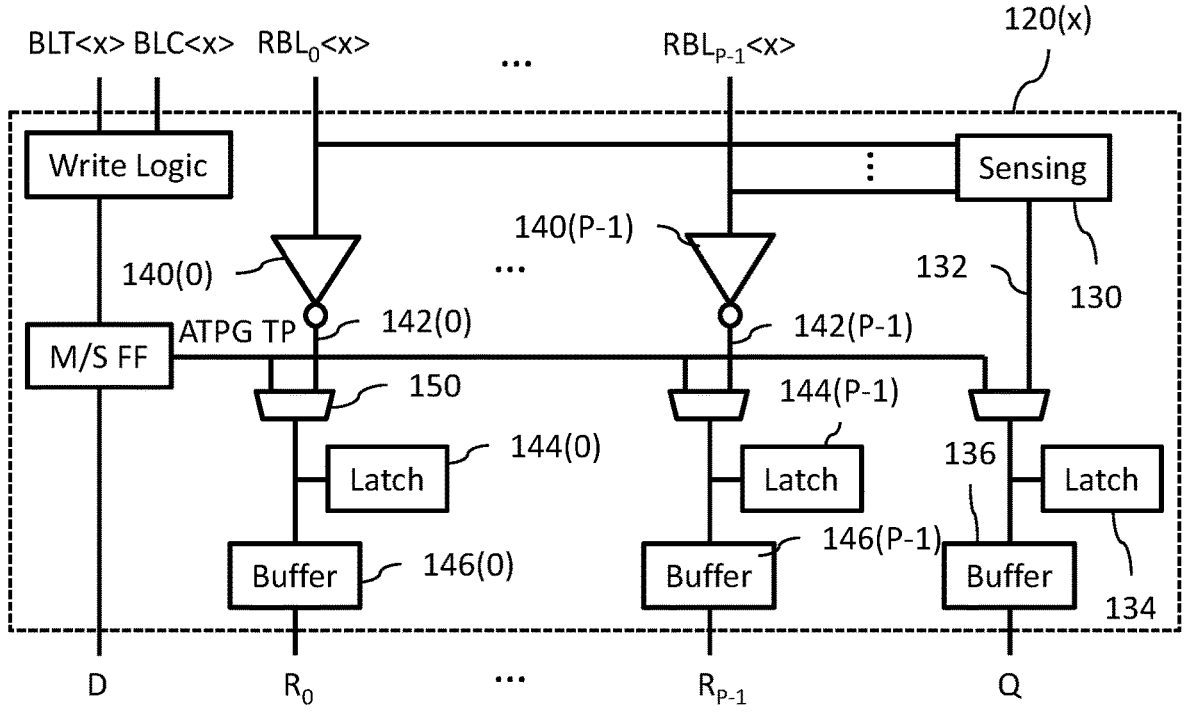
FIG. 4 shows a block diagram for an embodiment of a column input/output (I/O) circuit for the memory circuit in FIG. 3.

A block diagram of an embodiment for the column I/O circuit $120(x)$ is shown in FIG. 4. Here, x=0 to M−1. The data input port D is coupled to the complementary (write) bit lines BLT<x> and BLC<x> through a write logic circuit. The column I/O circuit $120(x)$ is coupled to the P local read bit lines $RBL_0<x>$ to $RBL_{P-1}<x>$ from the sub-arrays 113 for the column x in the array 112. A sensing circuit 130 is coupled to receive the data on the P local read bit lines $RBL_0<x>$ to $RBL_{P-1}<x>$ and generate a sensed data bit on signal line 132. The sensed data bit is latched by latch circuit 134 and buffered by buffer circuit 136 for output at the data output port Q. A sensing circuit 140(y) is coupled to receive the data on the local read bit line $RBL_y<x>$ and generate a sensed data bit on signal line 142(y). The sensed data bit is latched by latch circuit 144(y) and buffered by buffer circuit 146(y) for output at the sub-array data output port $R_y$. Here, y=0 to P-1.

It is important to be able to test the operation of the memory circuit 110. It is well known to those skilled in the art to utilize built-in self test (BIST) circuitry for memory testing (see, FIG. 3). The data path that is testable using BIST circuitry is the data path from the memory array 112 (loaded by the BIST circuit with test data TD) through the sensing circuit 130, latch circuit 134 and buffer circuit 136 to the data output port Q for return back to the BIST circuit for comparison to the loaded test data. That BIST testing, however, cannot effectively test the data path from the memory array 112 through the sensing circuit(s) 140(y), latch circuits 144(y) and buffer circuit(s) 146(y) to the sub-array data output port(s) $R_y$. To test this circuitry, a test pattern TP may be generated by an automated test pattern generation (ATPG) circuit (see, FIG. 3) and loaded through the data input port D to be supplied from a master/slave (M/S) flip flop (FF) circuit through multiplexing circuits 150, the sensing circuit(s) 140(y), latch circuits 144(y) and buffer circuit(s) 146(y) to the sub-array data output port(s) $R_y$, as well as the data output port Q, for return to the ATPG circuit for comparison to the test pattern. In ATPG test mode, the multiplexing circuits 150 selectively pass the ATPG test pattern data from the M/S FF circuit. When not in ATPG test mode, the multiplexing circuits 150 selectively pass the memory data read from the memory array 112.

It will be noted that such BIST and ATPG testing does not provide for a complete testing of the entire read circuitry portion of the column I/O circuit 120. Notably, none of the sensing circuit(s) 140(y) are tested. Additionally, those skilled in the art will note that ATPG testing is typically only performed at memory start-up while BIST testing can be performed at specified intervals during memory operation. This is a concern in mission critical (such as safety) applications which require continued and periodic testing be performed on the memory during operation. There would be an advantage if BIST testing could be applied to support the complete testing of the entire read circuitry portion of the column I/O circuit 120.

Figure 5:
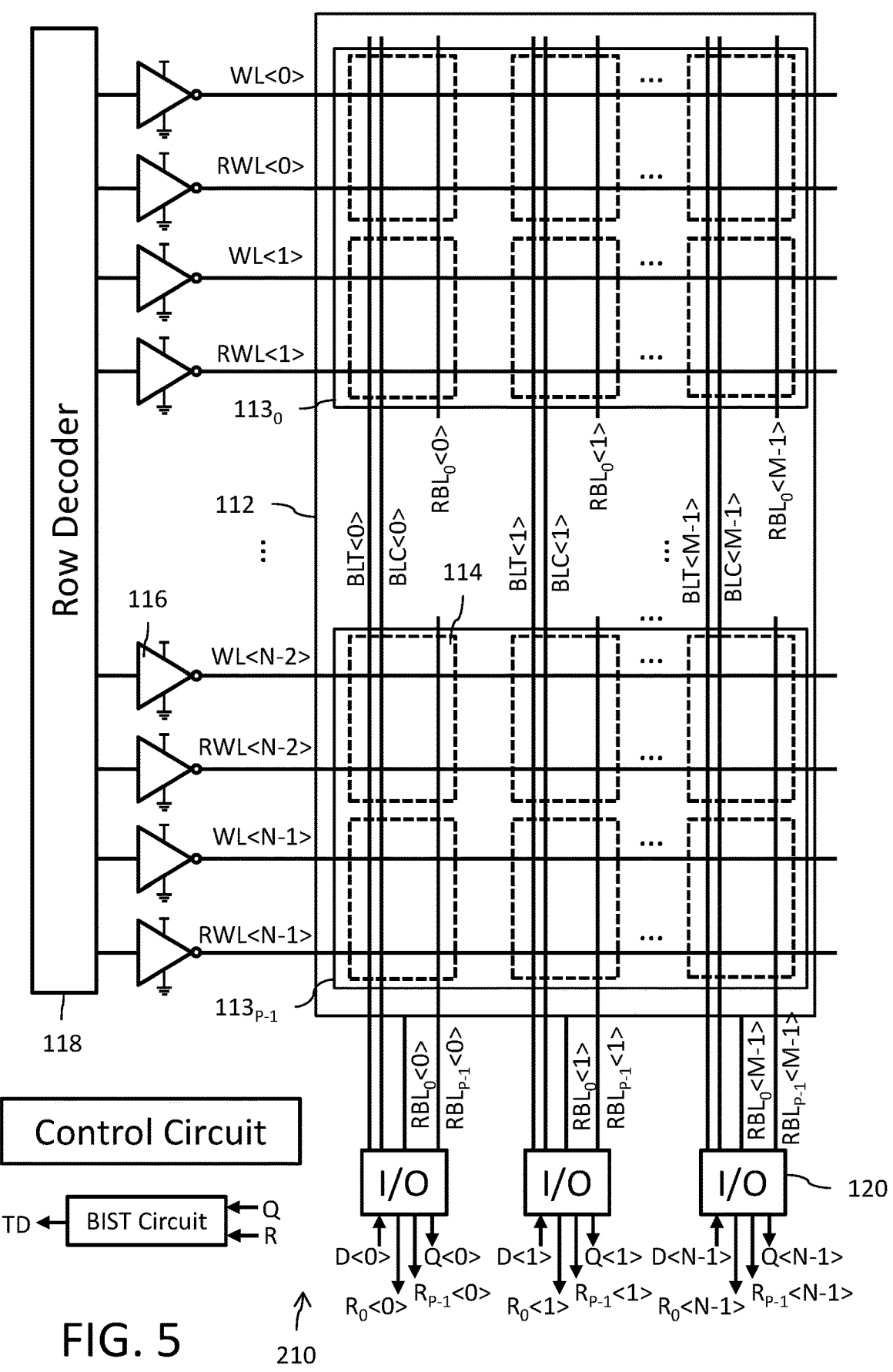
FIG. 5 is a schematic diagram of a memory circuit.

Reference is now made to FIG. 5 which shows a block diagram of a memory circuit 210. Like references in FIGS. 3 and 5 refer to same or similar components as previously described. The circuit 210 of FIG. 5 differs from the circuit 110 of FIG. 3 in that the BIST circuit has been updated to cover the sub-array data output port(s) $R_y$ with limited sets of test data TD patterns. As noted above in connection with the embodiment of FIG. 3, a more traditional BIST circuit configuration would provide coverage of the data output ports Q only to test the memory circuit for proper operation in support of the first mode of operation. With the specialized BIST circuit used in FIG. 5, however, BIST operation can test both the data output ports Q and the sub-array data output port(s) $R_y$ in connection with testing the memory circuit for proper operation in support of both the first and second modes of operation.

Figure 6:
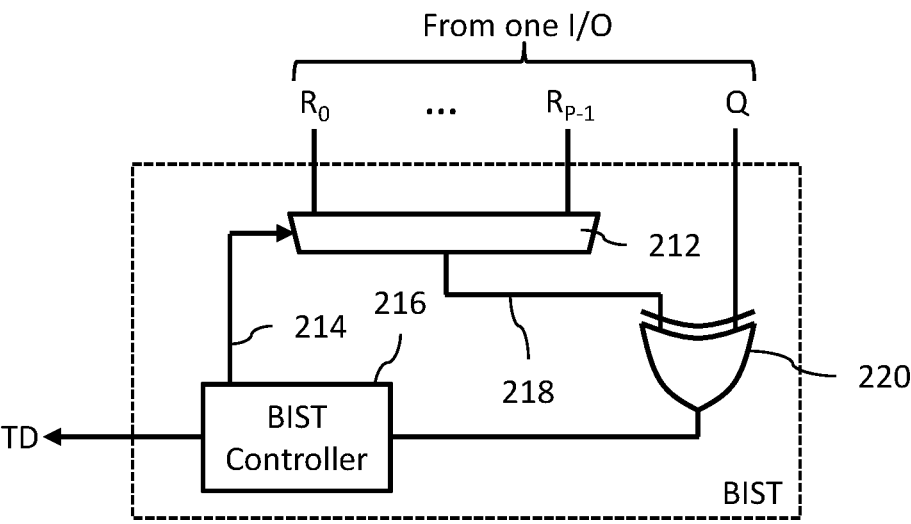
FIGS. 6 and 7 are schematic diagrams showing functionality of a built-in self test (BIST) circuit for the memory circuit in FIG. 5.

In an embodiment of the specialized BIST circuit shown in FIG. 6, a multiplexer 212 has data inputs coupled to the sub-array data output port(s) $R_y$ and a selection input that receives a selection signal 214 generated by a BIST control circuit 216. Responsive to the selection signal 214, the multiplexer 212 selectively passes the data from one of the sub-array data output port(s) $R_y$ for output on signal line 218. The selected data on signal line 218 is applied to a first input of a logical XOR gate 220. The second input of the logical XOR gate 220 is coupled to receive the data on the data output port Q. The output of the logical XOR gate 220 is applied to an input of the BIST control circuit 216.

During BIST testing of the memory, the BIST control circuit 216 generates BIST test data TD for application to the memory. The test data is configured to cause a simultaneous change in the output logic state of at least one of the sub-array data output port(s) $R_y$ and the output logic state of the data output port Q. The selection signal 214 is generated to cause the multiplexer 212 to select input from the sub-array data output port $R_y$ at which the applied BIST test data TD will cause the logic state change. The data test operation performed by the logical XOR gate 220 is a comparison operation and, more specifically, a match detection of whether the logic state of the data from one of the sub-array data output port(s) $R_y$ (selected by multiplexer 212) and the logic state of the data on the data output port Q are the same in response to the application of the BIST test data TD. Assertion logic high of the signal output from the logical XOR gate 220 indicates that both logic states at the inputs are the same. Responsive to an assertion of the logical XOR gate 220 output signal for each selected sub-array data output port $R_y$, the BIST control circuit 216 can confirm proper operation of the memory and the I/O circuit in support of the second mode of operation. In particular, this specialized BIST circuit will confirm proper operation of the sensing circuit(s) 140(y) (FIG. 4) which were not testable using ATPG mode or traditional BIST mode. Put another way, this specialized BIST circuit can test all data paths (for $R_y$ and Q outputs) through the I/O circuit 120.

It will be understood that the multiplexer 212 and logical XOR gate 220 circuitry is replicated in the BIST circuit for each column I/O circuit 120. Thus, the MUX and XOR gate circuitry shown in FIG. 6 is provided for each I/O circuit with a common BIST control circuit generating the test data TD, generating the MUX select signals and processing the XOR gate output signals during memory operation.

Figure 7:
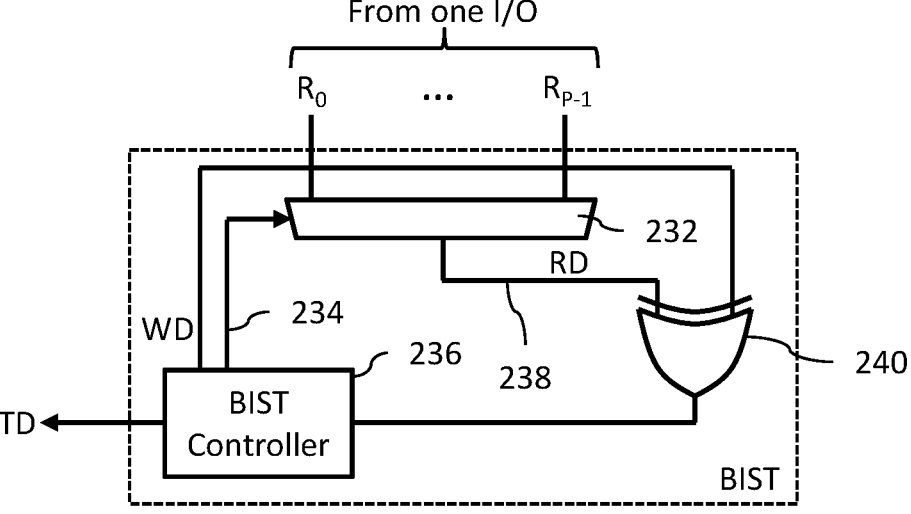

In an embodiment of the specialized BIST circuit shown in FIG. 7, a multiplexer 232 has data inputs coupled to the sub-array data output port(s) $R_y$ and a selection input that receives a selection signal 234 generated by a BIST control circuit 236. Responsive to the selection signal 234, the multiplexer 232 selectively passes the data from one of the sub-array data output port(s) $R_y$ for output on signal line 238. The selected data on signal line 238 is applied to a first input of a logical XOR gate 240. The second input of the logical XOR gate 240 is coupled to receive write data WD generated by the BIST control circuit 236. It will be noted that the write data WD is correlated to the test data TD applied to the memory. In other words, the write data WD will match the data which is written by the test data into the memory. The output of the logical XOR gate 240 is applied to an input of the BIST control circuit 236.

During BIST testing of the memory, the BIST control circuit 236 generates BIST test data TD for application to the memory. The test data is configured to cause certain write data WD to be written into the memory and be output as read data RD from a read bit line RBL and applied to the I/O circuit. The selection signal 234 is generated to cause the multiplexer 232 to select input from the sub-array data output port $R_y$ corresponding to the read bit line where the read data RD is output. The data test operation performed by the logical XOR gate 240 is a match detection of whether the logic state of the read data RD at one of the sub-array data output port(s) $R_y$ (selected by multiplexer 232) and the logic state of the write data WD generated by the BIST control circuit 236 are the same. Assertion logic high of the signal output from the logical XOR gate 220 indicates that both logic states at the input are the same. Responsive to an assertion of the logical XOR gate 220 signal for each selected sub-array data output port $R_y$, the BIST control circuit 216 can confirm proper operation of the memory and the I/O circuit in support of the second mode of operation. In particular, this specialized BIST circuit will confirm proper operation of the sensing circuit(s) 140(*y*) (FIG. 4) which were not testable using ATPG mode or traditional BIST mode. Put another way, this specialized BIST circuit can test all data paths (for $R_y$ and Q outputs) through the I/O circuit 120.

It will be understood that the multiplexer 232 and logical XOR gate 240 circuitry is replicated in the BIST circuit for each column I/O circuit 120. Thus, the MUX and XOR gate circuitry shown in FIG. 7 is provided for each I/O circuit with a common BIST control circuit generating the test data TD, generating the MUX select signals and processing the XOR gate output signals during memory operation.

Thus, for the implementation as shown in FIGS. 5-7, the BIST circuit is implemented with input from each I/O circuit 120 from both the data output port Q and the sub-array data output port(s) $R_y$. Traditional BIST testing of the memory using data generated at the data output port Q of each I/O circuit is supported in connection with confirming that the memory will properly operate in the first read mode of operation where the row decoder circuit 118 selectively actuates only one read word line RWL for the whole array 112 with a word line signal pulse to access a corresponding single one of the rows of memory cells 114. Specialized BIST testing of the memory using data generated at the sub-array data output ports $R_y$ of each I/O circuit is supported in connection with confirming that the memory will properly operate in the second read mode of operation where the row decoder circuit 118 selectively (and simultaneously) actuates one read word line RWL in each sub-array 113 in the memory array 112 with a word line signal pulse to access a corresponding single one of the rows of memory cells 114 in each sub-array 113. In this context, dedicated sets of reduced test data TD patterns (presenting no significant increase in test cost) can be generated by the BIST circuit in support of confirming (using the XOR logic gate of the BIST circuit) substantially simultaneous toggling of the data output port Q and each selected sub-array data output port $R_y$ in response to the test data. An advantage of this implementation is that no modification of the circuitry for the memory is needed in order to support BIST testing of all data paths within the I/O circuit 120.

Figure 8:
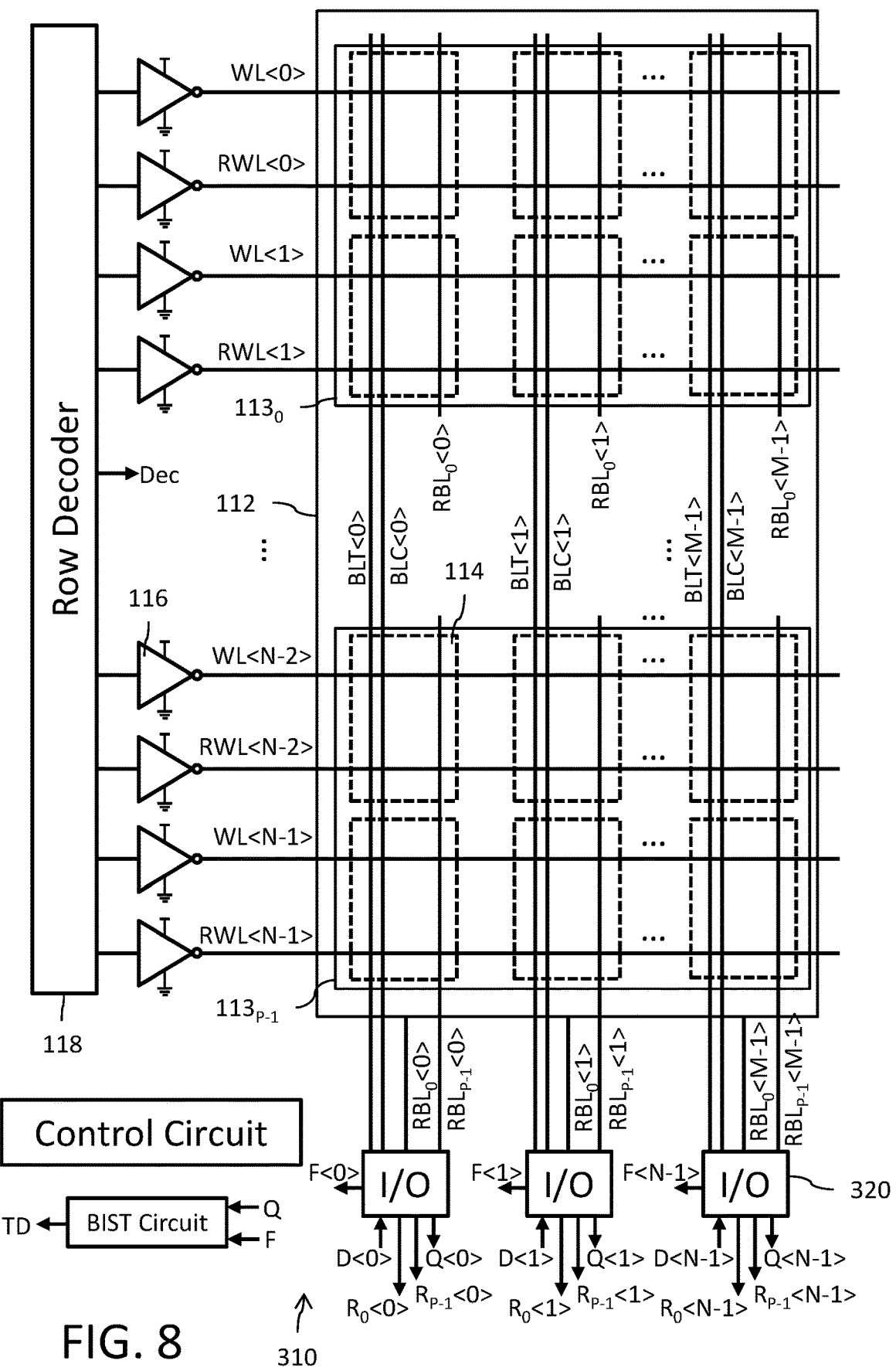
FIG. 8 is a schematic diagram of a memory circuit.

Reference is now made to FIG. 8 which shows a block diagram of a memory circuit 310. Like references in FIGS. 3 and 8 refer to same or similar components as previously described. The circuit 310 of FIG. 8 differs from the circuit 110 of FIG. 3 in the use of I/O circuits 320 as shown in FIG. 9.

Figures 9, 11:
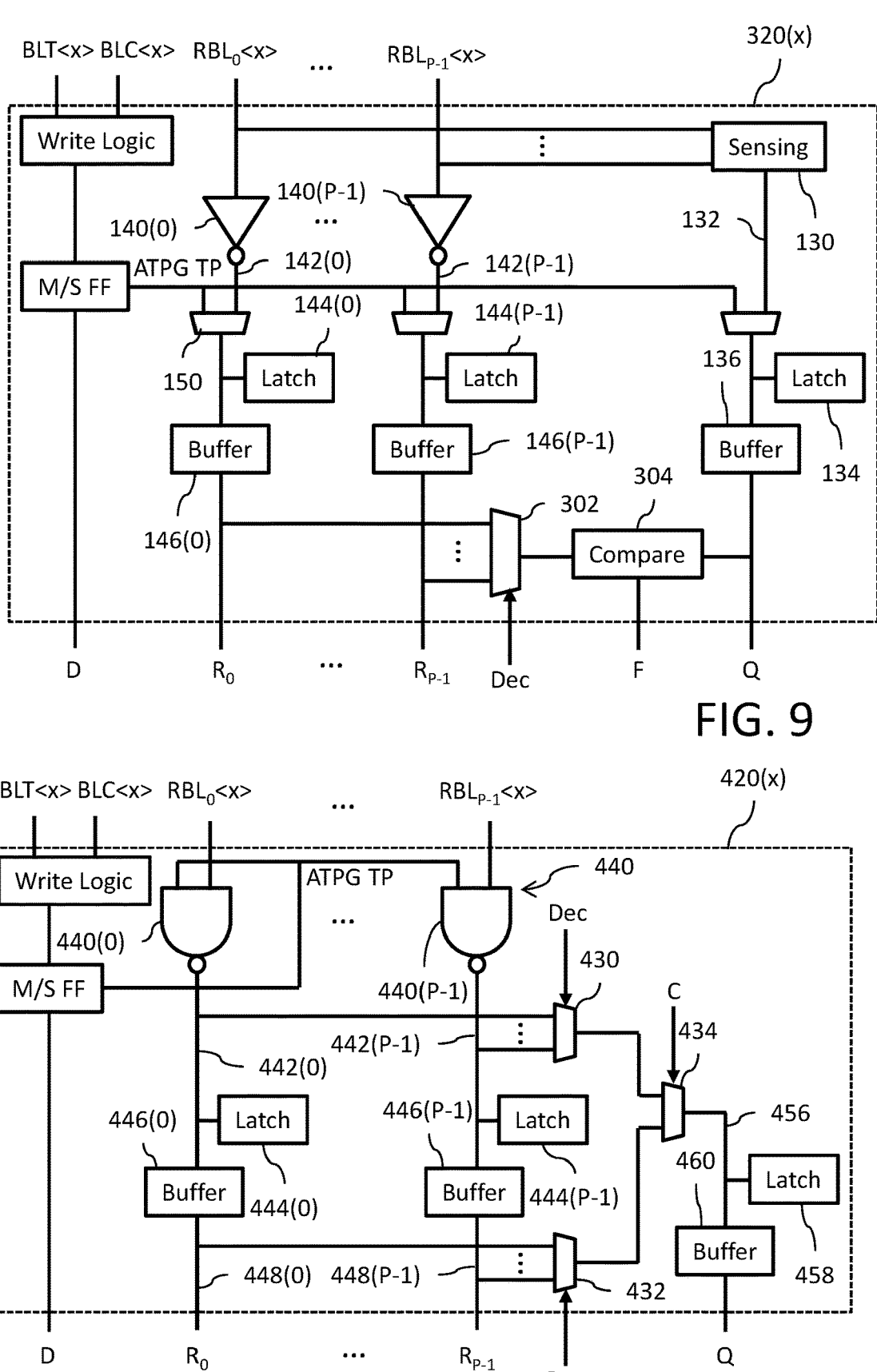
FIG. 9 shows a block diagram for an embodiment of a column I/O circuit for the memory circuit in FIG. 8.
FIG. 11 shows a block diagram for an embodiment of a column I/O circuit for the memory circuit in FIG. 10.

Like references in FIGS. 4 and 9 refer to same or similar components as previously described. The I/O circuit 320(*x*) of FIG. 9 differs from the I/O circuit 120(*x*) of FIG. 4 in that circuitry is included to generate a flag F signal dependent on a comparison of the data at the data output port Q and the data from a selected one of the sub-array data output ports $R_y$. This circuitry comprises a multiplexer circuit 302 having data inputs coupled to the sub-array data output ports $R_y$ and a selection input configured to receive a control signal Dec that is generated by row decoder 118 and is thus dependent on the decoded address, the first or second mode of memory operation and the word line (or lines) that are selectively actuated in order to selectively pass one of the data signals at the sub-array data output ports $R_y$ to the output of the multiplexer circuit 302. A comparator circuit 304 has a first input coupled to the output of the multiplexer circuit 302 and a second input coupled to the data output port Q. The flag F signal is generated at the output of the comparator circuit 304. In embodiment, the comparator circuit 304 may comprise a voltage comparator circuit or a logic circuit such as a logic XOR gate.

Although FIG. 9 shows the presence of the circuitry to generate the flag F signal within each I/O circuit 320, it will be understood that the memory could instead be implemented using the I/O circuit 120 with the circuitry to generate the flag F signal being implemented external to the memory (and perhaps located within the BIST circuit).

The circuit 310 of FIG. 8 further differs from the circuit 110 of FIG. 3 in that the BIST circuit has been updated to cover the sub-array data output port(s) $R_y$ with limited sets of test data TD patterns using the flag signal F. As noted above in connection with the embodiment of FIG. 3, a more traditional BIST circuit configuration would provide coverage of the data output ports Q only to test the memory circuit for proper operation in support of the first mode of operation. With the specialized BIST circuit used in FIG. 8, however, BIST operation can directly test the data output ports Q and indirectly test the sub-array data output port(s) $R_y$ through the flag signal F. Testing of the data output ports Q can be performed using traditional BIST testing operations. However, by also using specialized BIST through the flag signal F, the BIST circuit can effectively test all data paths through the I/O circuit 320 for proper operation in support of the second mode of operation.

The BIST test data TD applied by the BIST circuit to the memory will induce a certain data state to appear on a given read bit line RBL. If the flag F signal is asserted, this means that the same certain data state from the read bit line RBL is present at both the data output port Q and the selected one of the sub-array data output ports $R_y$. The logic state of the flag signal evaluated by the BIST circuit accordingly indicates whether the data paths through the I/O circuit 320 to the data output port Q and the selected one of the sub-array data output ports $R_y$ are properly operating in support of the first and second modes of operation.

It will be understood that the flag F signal generating circuitry is provided in each I/O circuit 320 and is testable by the BIST circuit for confirming proper operation of the data path in each column I/O circuit 320.

Thus, for the implementation as shown in FIGS. 8-9, the BIST circuit is implemented with input from each I/O circuit 320 from both the data output port Q and the flag F signal (dependent on a comparison of the data at a selected one of sub-array data output ports $R_y$ to the data present at the data output port Q). Traditional BIST testing of the memory using data generated at the data output port Q of each I/O circuit is supported in connection with confirming that the memory will properly operate in the first read mode of operation where the row decoder circuit 118 selectively actuates only one read word line RWL for the whole array 112 with a word line signal pulse to access a corresponding single one of the rows of memory cells 114. Specialized BIST testing of the memory using the data of the flag F signal from each I/O circuit is supported in connection with confirming that the memory will properly operate in the second read mode of operation where the row decoder circuit 118 selectively (and simultaneously) actuates one read word line RWL in each sub-array 113 in the memory array 112 with a word line signal pulse to access a corresponding single one of the rows of memory cells 114 in each sub-array 113. In this context, dedicated sets of reduced test data TD patterns (presenting no significant increase in test cost) can be generated by the BIST circuit in support of confirming (using the logic state of the flag F signal) substantially simultaneous toggling of the data output port Q and each selected sub-array data output port $R_y$ in response to the test data.

Figure 10:
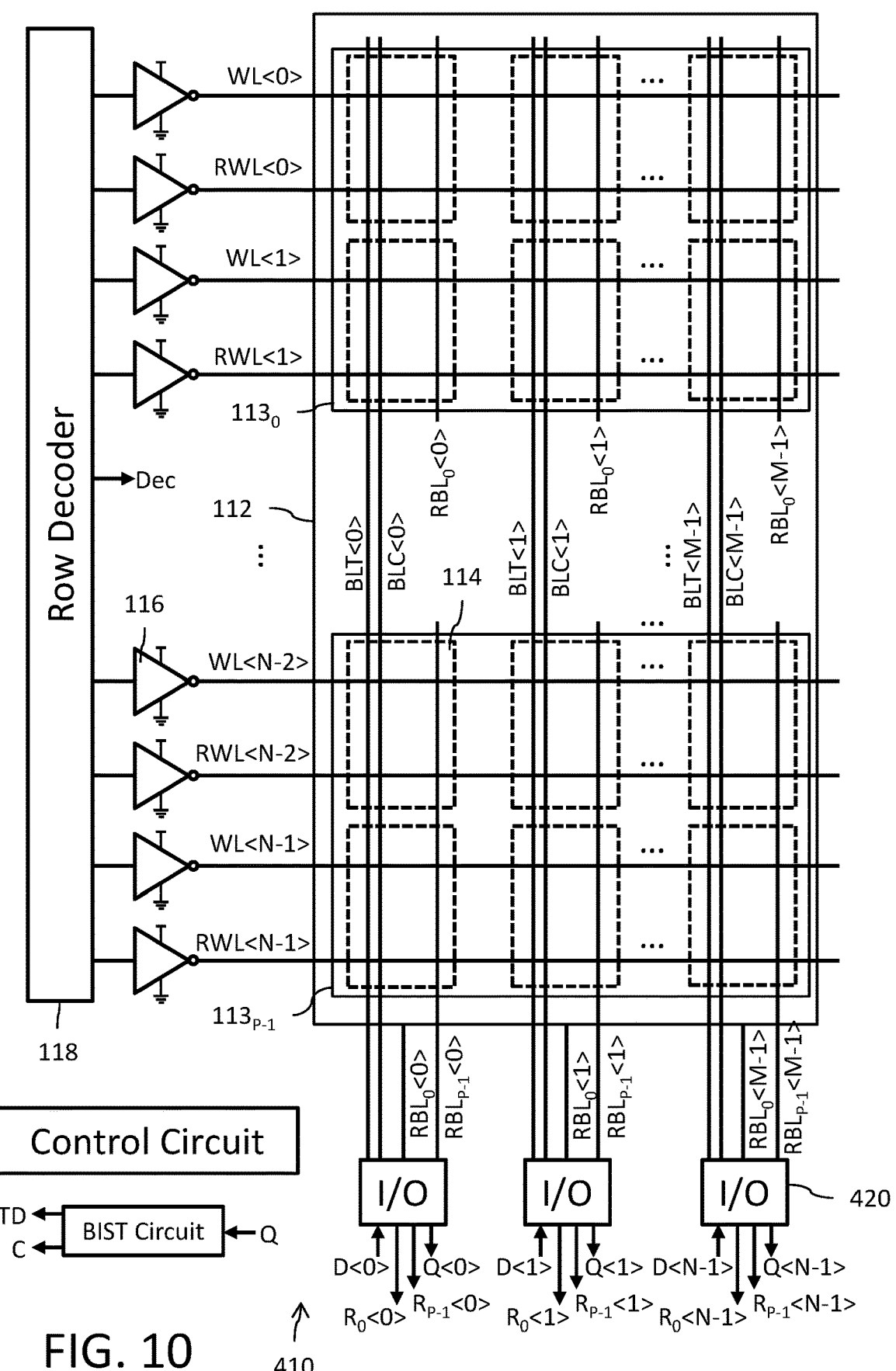
FIG. 10 is a schematic diagram of a memory circuit.

Reference is now made to FIG. 10 which shows a block diagram of a memory circuit 410. Like references in FIGS. 3 and 10 refer to same or similar components as previously described. The circuit 410 of FIG. 10 differs from the circuit 110 of FIG. 3 in the use of I/O circuits 420 as shown in FIG. 11.

The block diagram of a further embodiment for the column I/O circuit 420(x) in FIG. 11 shows the data input port D coupled to the complementary (write) bit lines BLT and BLC through a write logic circuit. Here, x=0 to M−1. The column I/O circuit 420(x) is coupled to the P local read bit lines $RBL_0$<x> to $RBL_{P-1}$<x> from the sub-arrays 113 for the column x in the array 112. Sensing circuitry 440, formed for example by a set of logic NAND gates, is coupled to receive the data on the P local read bit lines $RBL_0$<x> to $RBL_{P-1}$<x> and generate corresponding sensed data bits on signal lines 442(y). Each sensed data bit is latched by latch circuit 444(y) and buffered by buffer circuit 446(y) for output on signal line 448(y) at the sub-array data output port $R_y$. Here, y=0 to P−1. The sensed data bits on the signal lines 442(y) are further applied to the input of first multiplexer circuit 430. The data bits on the signal lines 448(y) are further applied to the inputs of a second multiplexer circuit 432. The selection (control) inputs of the first and second multiplexer circuits 430 and 432 receive a control signal Dec that is generated by row decoder 118 and is thus dependent on the decoded address, the first or second mode of memory operation and the word line (or lines) that are selectively actuated in order to selectively pass one of the data signals on the signal lines 442(y) to the output of the first multiplexer circuit 430 and further selectively pass one of the data signals on a corresponding one of the signal lines 448(y) to the output of the second multiplexer circuit 432. The signal outputs of the first and second multiplexer are applied to the inputs of third multiplexer circuit 434. The selection (control) input of the third multiplexer circuit 234 receives a control signal C. The generation of control signal C can be controlled by the BIST circuit as part of the BIST testing operation to selectively pass the data signal output from the first multiplexer circuit 230 or the data signal output from the second multiplexer circuit 232. The data bit output from the third multiplexer circuit 434 on signal line 456 is latched by latch circuit 458 and buffered by buffer circuit 460 for output at the data output port Q.

With the use of logic NAND gates 440(0) to 440(P−1) for sensing circuitry 440, a first input of each NAND gate is coupled to a corresponding one of the local read bit lines RBL0<x> to RBLP−1<x>. The second inputs of the logic NAND gates 440(0) to 440(P−1) are coupled to receive a test pattern TP generated by an automated test pattern generation (ATPG) circuit and loaded through the data input port D to be supplied from a master/slave (M/S) flip flop (FF) circuit. In ATPG test mode, the data for the test pattern are passed through the logic NAND gates 440(0) to 440(P−1) to the corresponding signal lines 442(y). When not in ATPG test mode, the logic NAND gates 440(0) to 440(P−1) pass the data bits from the local read bit lines RBL0<x> to RBLP−1<x> to the corresponding signal lines 442(y).

In an implementation where ATPG test mode need not be supported, the sensing circuitry 440 may comprise logic NOT gates, in place of the logic NAND gates 440(0) to 440(P−1), such as with gates 140(0) to 140(P−1) shown in FIG. 4.

It will be noted that the implementation of the column I/O circuit 420 as shown in FIG. 11 supports the testing of multiple data paths using BIST circuitry and indeed supports the complete testing of the entire read circuitry portion of the column I/O circuit 420. One data path that is testable using BIST circuitry is the data path from the memory array 112 through the sensing circuit 440, latch circuit 458 and buffer circuit 460 to the data output port Q (when the control signal C has a first logic state in one BIST testing operation mode to select the output of the first multiplexer 430). Another path that is testable using BIST circuitry is the data path from the memory array 112 through the sensing circuit 440, latch circuit 444 and buffer circuit 446 (at the sub-array data output port $R_y$), latch circuit 456 and buffer circuit 458 to the data output port Q (where the control signal C has a second logic state in another BIST testing operation mode to select the output of the second multiplexer 432).

There is a load coupled to each of the sub-array data output ports $R_y$, and this will introduce a timing delay in the propagation of the BIST testing signals through the data path which includes the second multiplexer circuit 432 and the second input of the third multiplexer circuit 434. This timing delay may be a concern in certain BIST testing operations for mission critical (such as safety) applications which require a relatively speaking faster testing speed. In non-mission critical implementations, BIST testing of the data paths for the sub-array data output ports $R_y$ is supported through multiplexers 432 and 434 to the data output port Q. In this context, limited sets of the test data TD patterns can be generated by the BIST circuit and coverage is run for an optimized test time.

Thus, for the implementation as shown in FIGS. 10-11, the BIST circuit is implemented with input from each I/O circuit 120 from only the data output port Q. Traditional BIST testing of the memory using data generated at the data output port Q of each I/O circuit is supported in connection with confirming that the memory will properly operate in the first read mode of operation (control signal C causing MUX 434 to select output from MUX 430) where the row decoder circuit 118 selectively actuates only one read word line RWL for the whole array 112 with a word line signal pulse to access a corresponding single one of the rows of memory cells 114. Specialized BIST testing of the memory using data generated at the data output port Q of each I/O circuit is supported in connection with confirming that the memory will properly operate in the second read mode of operation (control signal C causing MUX 434 to select output from MUX 432) where the row decoder circuit 118 selectively (and simultaneously) actuates one read word line RWL in each sub-array 113 in the memory array 112 with a word line signal pulse to access a corresponding single one of the rows of memory cells 114 in each sub-array 113. In this context, dedicated sets of reduced test data TD patterns (presenting no significant increase in test cost) can be generated by the BIST circuit in support of confirming (using the XOR logic gate of the BIST circuit) proper toggling of the data output port Q in response to the test data.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A memory circuit, comprising:
a memory array including a plurality of sub-arrays, wherein each sub-array includes memory cells arranged in a matrix with plural rows and plural columns, each row including a word line connected to the memory cells of the row, and each column including a local bit line connected to the memory cells of the column;
a word line drive circuit for each row having an output connected to drive the word line of the row;
a row decoder circuit configured to support two modes of memory circuit operation including: a first mode where the row decoder circuit actuates only one word line in the memory array during a memory read and a second mode where the row decoder circuit simultaneously actuates one word line per sub-array during the memory read;
an input/output circuit for each column comprising:
a plurality of bit line inputs coupled to the local bit lines of the sub-arrays;
a column data output coupled to the plurality of bit line inputs; and
a plurality of sub-array data outputs, where each sub-array data output is coupled to a corresponding bit line input; and
a built-in self test (BIST) circuit configured to perform BIST testing of the memory circuit dependent on data generated at the column data output and perform BIST testing of the memory circuit dependent on data generated at the plurality of sub-array data outputs;
wherein the BIST circuit comprises:
a multiplexing circuit having inputs coupled to the plurality of sub-array data outputs and a selection input configured to receive a selection signal;
a comparison circuit having a first input coupled to receive an output of the multiplexing circuit and a second input coupled to the column data output; and
a BIST control circuit configured to generate the selection signal to cause the multiplexing circuit to select data from one of the plurality of sub-array data outputs for comparison by said comparison circuit to data at the column data output.

2. The circuit of claim 1, wherein said BIST control circuit is configured to apply test data to the memory cells of the memory array and further configured to process data generated at the column data output in response to the test data to test the memory circuit for operation in the first mode of memory circuit operation and process data generated at an output of the comparison circuit in response to the test data to test the memory circuit for operation in the second mode of memory circuit operation.

3. A memory circuit, comprising:
a memory array including a plurality of sub-arrays, wherein each sub-array includes memory cells arranged in a matrix with plural rows and plural columns, each row including a word line connected to the memory cells of the row, and each column including a local bit line connected to the memory cells of the column;
a word line drive circuit for each row having an output connected to drive the word line of the row;
a row decoder circuit configured to support two modes of memory circuit operation including: a first mode where the row decoder circuit actuates only one word line in the memory array during a memory read and a second mode where the row decoder circuit simultaneously actuates one word line per sub-array during the memory read;
an input/output circuit for each column comprising:
a plurality of bit line inputs coupled to the local bit lines of the sub-arrays;
a column data output coupled to the plurality of bit line inputs; and
a plurality of sub-array data outputs, where each sub-array data output is coupled to a corresponding bit line input; and
a built-in self test (BIST) circuit configured to perform BIST testing of the memory circuit dependent on data generated at the column data output and perform BIST testing of the memory circuit dependent on data generated at the plurality of sub-array data outputs;
wherein the BIST circuit comprises:
a multiplexing circuit having inputs coupled to the plurality of sub-array data outputs and a selection input configured to receive a selection signal;
a comparison circuit having a first input coupled to receive a read data signal output of the multiplexing circuit and a second input coupled to receive a write data signal; and
a BIST control circuit configured to generate test data for application to the memory circuit, said test data including said write data signal, and configured to generate the selection signal to cause the multiplexing circuit to select said read data signal from one of the plurality of sub-array data outputs for comparison by said comparison circuit to said write data signal.

4. The circuit of claim 3, wherein said comparison circuit comprises a logical XOR circuit.

5. The circuit of claim 3, wherein data at the column data output is dependent on the write data signal of said test data.

6. The circuit of claim 3, wherein the BIST circuit is configured to process data generated at the column data output in response to the test data to test the memory circuit for operation in the first mode of memory circuit operation and process data generated at an output of the comparison circuit in response to the test data to test the memory circuit for operation in the second mode of memory circuit operation.

7. A memory circuit, comprising:
a memory array including a plurality of sub-arrays, wherein each sub-array includes memory cells arranged in a matrix with plural rows and plural columns, each row including a word line connected to the memory cells of the row, and each column including a local bit line connected to the memory cells of the column;
a word line drive circuit for each row having an output connected to drive the word line of the row;
a row decoder circuit configured to support two modes of memory circuit operation including: a first mode where the row decoder circuit actuates only one word line in the memory array during a memory read and a second mode where the row decoder circuit simultaneously actuates one word line per sub-array during the memory read;

an input/output circuit for each column comprising:

a plurality of bit line inputs coupled to the local bit lines of the sub-arrays;

a column data output coupled to the plurality of bit line inputs; and a plurality of sub-array data outputs, where each sub-array data output is coupled to a corresponding bit line input;

a built-in self test (BIST) circuit configured to perform BIST testing of the memory circuit dependent on data generated at the column data output and perform BIST testing of the memory circuit dependent on data generated at the plurality of sub-array data outputs;

a multiplexing circuit having inputs coupled to the plurality of sub-array data outputs and a selection input configured to receive a selection signal; and a comparison circuit having a first input coupled to receive a read data signal output of the multiplexing circuit and a second input coupled to the column data output;

wherein said BIST circuit is configured to perform BIST testing of the memory circuit when in the second mode of memory circuit operation dependent on a flag signal generated at an output of the comparison circuit.

8. The circuit of claim 7, wherein said multiplexing circuit and comparison circuit are components in each input/output circuit and the flag signal is an output of each input/output circuit.

9. The circuit of claim 7, wherein said selection signal is generated by the row decoder circuit dependent on word line actuation and mode of memory circuit operation.

10. The circuit of claim 7, wherein said BIST circuit is configured to apply test data to the memory cells of the memory array and further configured to process data generated at the column data output in response to the test data to test the memory circuit for operation in the first mode of memory circuit operation and process the flag signal in response to the test data to test the memory circuit for operation in the second mode of memory circuit operation.

11. A memory circuit, comprising:

a memory array including a plurality of sub-arrays, wherein each sub-array includes memory cells arranged in a matrix with plural rows and plural columns, each row including a word line connected to the memory cells of the row, and each column including a local bit line connected to the memory cells of the column;

a word line drive circuit for each row having an output connected to drive the word line of the row;

a row decoder circuit configured to support two modes of memory circuit operation including: a first mode where the row decoder circuit actuates only one word line in the memory array during a memory read and a second mode where the row decoder circuit simultaneously actuates one word line per sub-array during the memory read;

an input/output circuit for each column comprising:

a plurality of bit line inputs coupled to the local bit lines of the sub-arrays;

a column data output coupled to the plurality of bit line inputs; and a plurality of sub-array data outputs, where each sub-array data output is coupled to a corresponding bit line input; and a built-in self test (BIST) circuit configured to perform BIST testing of the memory circuit dependent on data generated at the column data output and perform BIST testing of the memory circuit dependent on data generated at the plurality of sub-array data outputs;

wherein each input/output circuit further comprises:

a first multiplexing circuit having inputs coupled to the plurality of bit line inputs and a selection input configured to receive a selection signal;

a second multiplexing circuit having inputs coupled to the plurality of sub-array data outputs and a selection input configured to receive said selection signal; and a third multiplexing circuit having inputs coupled to outputs of the first and second multiplexing circuits and a selection input configured to receive a control signal;

wherein said column data output coupled to an output of the third multiplexing circuit; and wherein said BIST circuit is configured to apply a first logic state for the control signal and perform BIST testing of the memory circuit dependent on data generated at the column data output from data at the plurality of bit line inputs and configured to apply a second logic state for the control signal and perform BIST testing of the memory circuit dependent on data generated at the column data output from data at the plurality of sub-array data outputs.

12. The circuit of claim 11, wherein said selection signal is generated by the row decoder circuit dependent on word line actuation and mode of memory circuit operation.

13. The circuit of claim 12, wherein said BIST circuit is configured to apply test data to the memory cells of the memory array and further configured to process data generated at the output of the first multiplexing circuit in response to the test data to test the memory circuit for operation in the first mode of memory circuit operation and process data generated at the output of the second multiplexing circuit in response to the test data to test the memory circuit for operation in the second mode of memory circuit operation.

14. A memory circuit, comprising:

a memory array including a plurality of sub-arrays, wherein each sub-array includes memory cells arranged in a matrix with plural rows and plural columns, each row including a word line connected to the memory cells of the row, and each column including a local bit line connected to the memory cells of the column;

a word line drive circuit for each row having an output connected to drive the word line of the row;

a row decoder circuit configured to support two modes of memory circuit operation including: a first mode where the row decoder circuit actuates only one word line in the memory array during a memory read and a second mode where the row decoder circuit simultaneously actuates one word line per sub-array during the memory read;

an input/output circuit for each column comprising:

a plurality of bit line inputs coupled to the local bit lines of the sub-arrays;

a column data output coupled to the plurality of bit line inputs; and a plurality of sub-array data outputs, where each sub-array data output is coupled to a corresponding bit line input; and a built-in self test (BIST) circuit configured to:

apply BIST test data to the memory cells of the memory array;

process data generated at the column data output in response to the applied test data to test the memory circuit for proper operation in support of the first mode of operation;

compare said data generated at the column data output to data generated at a selected one of the plurality of sub-array data outputs in response to the applied test data; and process a result of the comparison to test the memory circuit for proper operation in support of the second mode of operation.

15. The circuit of claim 14, wherein the BIST circuit comprises:

a multiplexing circuit having inputs coupled to the plurality of sub-array data outputs and a selection input configured to receive a selection signal;

a comparison circuit having a first input coupled to receive an output of the multiplexing circuit and a second input coupled to the column data output; and a BIST control circuit configured to generate the selection signal to cause the multiplexing circuit to select data from one of the plurality of sub-array data outputs for comparison by said comparison circuit to data at the column data output.

16. A memory circuit, comprising:

a memory array including a plurality of sub-arrays, wherein each sub-array includes memory cells arranged in a matrix with plural rows and plural columns, each row including a word line connected to the memory cells of the row, and each column including a local bit line connected to the memory cells of the column;

a word line drive circuit for each row having an output connected to drive the word line of the row;

a row decoder circuit configured to support two modes of memory circuit operation including: a first mode where the row decoder circuit actuates only one word line in the memory array during a memory read and a second mode where the row decoder circuit simultaneously actuates one word line per sub-array during the memory read;

an input/output circuit for each column comprising:

a plurality of bit line inputs coupled to the local bit lines of the sub-arrays;

a column data output coupled to the plurality of bit line inputs; and a plurality of sub-array data outputs, where each sub-array data output is coupled to a corresponding bit line input; and a built-in self test (BIST) circuit configured to:

apply BIST test data to the memory cells of the memory array, said test data corresponding to write data;

process data generated at the column data output in response to the applied test data to test the memory circuit for proper operation in support of the first mode of operation;

compare said write data to read data generated at a selected one of the plurality of sub-array data outputs in response to the applied test data; and process a result of the comparison to test the memory circuit for proper operation in support of the second mode of operation;

wherein the BIST circuit comprises:

a multiplexing circuit having inputs coupled to the plurality of sub-array data outputs and a selection input configured to receive a selection signal;

a comparison circuit having a first input coupled to receive said read data and a second input coupled to receive said write data; and a BIST control circuit configured to generate the selection signal to cause the multiplexing circuit to select said read data from one of the plurality of sub-array data outputs for comparison by said comparison circuit to the write data.

17. A memory circuit, comprising:

a memory array including a plurality of sub-arrays, wherein each sub-array includes memory cells arranged in a matrix with plural rows and plural columns, each row including a word line connected to the memory cells of the row, and each column including a local bit line connected to the memory cells of the column;

a word line drive circuit for each row having an output connected to drive the word line of the row;

a row decoder circuit configured to support two modes of memory circuit operation including: a first mode where the row decoder circuit actuates only one word line in the memory array during a memory read and a second mode where the row decoder circuit simultaneously actuates one word line per sub-array during the memory read;

an input/output circuit for each column comprising:

a plurality of bit line inputs coupled to the local bit lines of the sub-arrays;

a column data output coupled to the plurality of bit line inputs; and a plurality of sub-array data outputs, where each sub-array data output is coupled to a corresponding bit line input; and a built-in self test (BIST) circuit configured to:

apply BIST test data to the memory cells of the memory array;

process data generated at the column data output in response to the applied test data to test the memory circuit for proper operation in support of the first mode of operation;

compare said data generated at the column data output to data generated at a selected one of the plurality of sub-array data outputs in response to the applied test data to generate a flag signal; and process the flag signal to test the memory circuit for proper operation in support of the second mode of operation.

18. The circuit of claim 17, wherein each input/output circuit comprises:

a multiplexing circuit having inputs coupled to the plurality of sub-array data outputs and a selection input configured to receive a selection signal; and a comparison circuit having a first input coupled to receive a read data signal output of the multiplexing circuit, a second input coupled to the column data output, and an output configured to generate said flag signal.

19. A memory circuit, comprising:

a memory array including a plurality of sub-arrays, wherein each sub-array includes memory cells arranged in a matrix with plural rows and plural columns, each row including a word line connected to the memory cells of the row, and each column including a local bit line connected to the memory cells of the column;

a word line drive circuit for each row having an output connected to drive the word line of the row;

a row decoder circuit configured to support two modes of memory circuit operation including: a first mode where the row decoder circuit actuates only one word line in the memory array during a memory read and a second mode where the row decoder circuit simultaneously actuates one word line per sub-array during the memory read;

an input/output circuit for each column comprising:

a plurality of bit line inputs coupled to the local bit lines of the sub-arrays;

a column data output coupled to the plurality of bit line inputs; and a plurality of sub-array data outputs, where each sub-array data output is coupled to a corresponding bit line input; and a built-in self test (BIST) circuit configured to:

apply BIST test data to the memory cells of the memory array;

select data generated at the plurality of bit line inputs in response to the applied test data for output at the column data output during memory circuit operation in the first mode of operation;

process said data generated at the column data output to test the memory circuit for proper operation in support of the first mode of operation;

select data generated at the plurality of sub-array data outputs in response to the applied test data for output at the column data output during memory circuit operation in the second mode of operation; and process said data generated at the column data output to test the memory circuit for proper operation in support of the second mode of operation;

wherein each input/output circuit comprises:

a first multiplexing circuit having inputs coupled to the plurality of bit line inputs and a selection input configured to receive a selection signal;

a second multiplexing circuit having inputs coupled to the plurality of sub-array data outputs and a selection input configured to receive said selection signal; and a third multiplexing circuit having inputs coupled to outputs of the first and second multiplexing circuits and a selection input configured to receive a control signal;

wherein said column data output is coupled to an output of the third multiplexing circuit; and wherein said BIST circuit is configured to apply a first logic state for the control signal during BIST testing of the memory circuit operating in the first mode of operation and configured to apply a second logic state for the control signal during BIST testing of the memory circuit operating in the second mode of operation.

\* \* \* \* \*